United States Patent [19]

Nussbaum et al.

[11] Patent Number: 5,673,051
[45] Date of Patent: Sep. 30, 1997

[54] DISCRETE PHASE MODULATOR

[75] Inventors: Howard S. Nussbaum, Los Angeles; William P. Posey, Palos Verdes Estates; Steve I. Hsu, Rancho Palos Verdes; Stephen D. Taylor, Agoura, all of Calif.

[73] Assignee: Hughes Electronics, Los Angeles, Calif.

[21] Appl. No.: 576,325

[22] Filed: Dec. 21, 1995

[51] Int. Cl.[6] .................................................. G01S 13/00
[52] U.S. Cl. ................................................ 342/202
[58] Field of Search .................................. 342/134, 135, 342/159, 162, 175, 195, 202, 203; 379/279, 280, 281; 327/233, 237; 332/103, 104, 105

[56] References Cited

U.S. PATENT DOCUMENTS

| | | | |
|---|---|---|---|
| 4,168,397 | 9/1979 | Bradley | 332/104 |
| 4,608,706 | 8/1986 | Chang et al. | 377/39 |
| 5,066,927 | 11/1991 | Dent | 331/1 A |
| 5,479,458 | 12/1995 | Tanaka | 375/376 |

Primary Examiner—Daniel T. Pihulic
Attorney, Agent, or Firm—Leonard A. Alkov; Wanda K. Denson-Low

[57] ABSTRACT

Discrete phase modulation for modulating the transmit and receive radar signal waveforms in order to control distortion. The signal is modulated by discrete phases which change from pulse-to-pulse. A digital frequency division circuit accurately generates the modulation signals, and allows the discrete phases to be generated with precise accuracy. The discrete phase changes can be a quadratic phase progression for target Doppler and range detection.

15 Claims, 4 Drawing Sheets

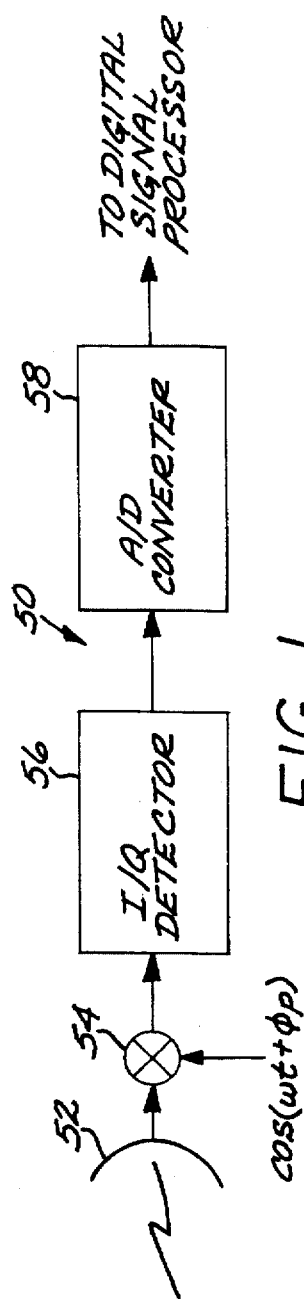
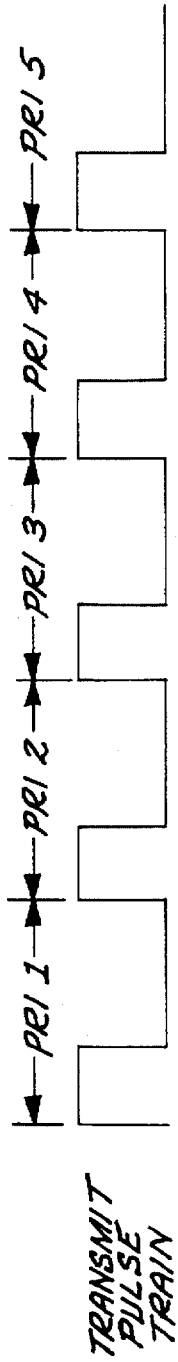
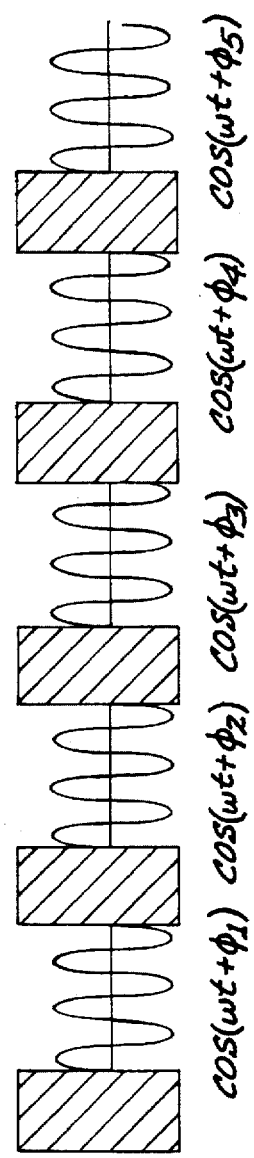
FIG. 1
FIG. 2A  TRANSMIT PULSE TRAIN
FIG. 2B  RECEIVE INTERVALS
FIG. 2C  MODULATION SIGNAL

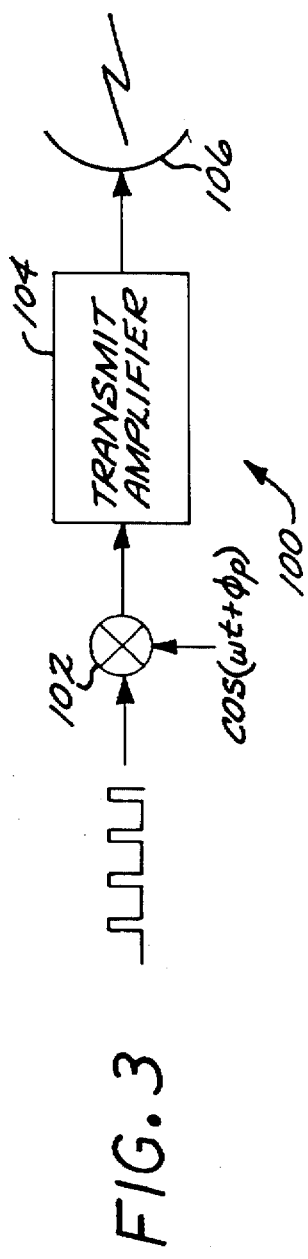
FIG. 3
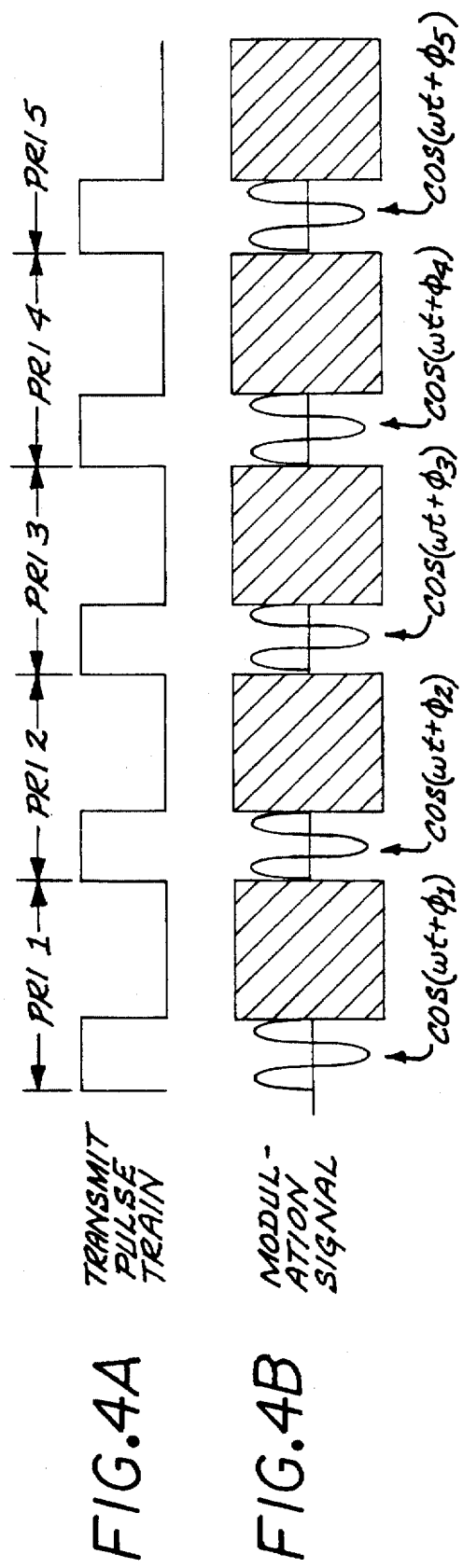
FIG. 4A
FIG. 4B
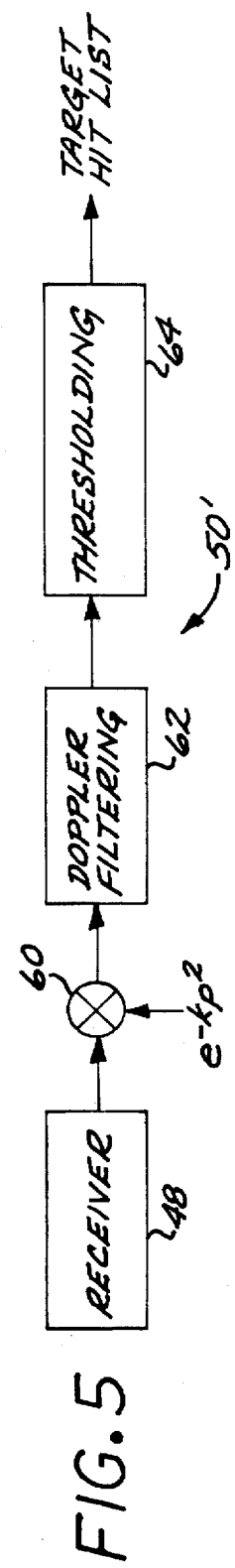
FIG. 5

DISCRETE PHASE MODULATOR

This invention was made with Government support under contract awarded by the Government. The Government has certain rights in this invention.

CROSS-REFERENCE TO RELATED APPLICATIONS

This application is related to the following copending, commonly assigned applications: DIGITAL FREQUENCY DIVIDER PHASE SHIFTER, S. I. Hsu et al, Ser. No. 08/576,329, filing date Dec. 21, 1995, attorney docket number PD-93310; SYSTEM AND METHOD FOR RADAR RECEIVER HARMONIC DISTORTION AND SPURIOUS RESPONSE CONTROL, W. P. Posey et al., Ser. No. 08/576,327, filing date Dec. 21, 1995, attorney docket number PD-93283; PRECISION DIGITAL PHASE SHIFTER, S. D. Taylor et al., Ser. No. 08/576,328, filing date Dec. 21, 1995, attorney docket number PD-92593; PRECISION DIGITAL PHASE SHIFT ELEMENT, S. D. Taylor et al., Ser. No. 08/576,330, filing date Dec. 21, 1995, attorney docket number PD-95214; and DIGITAL COUNTER AND COMPARATOR BASED PRECISION PHASE SHIFT ELEMENT, S. D. Taylor et al., Ser. No. 08/576,326, filing date Dec. 21, 1995, attorney docket number PD-95215; the entire contents of these copending applications are incorporated herein by this reference.

TECHNICAL FIELD OF THE INVENTION

The invention relates to a radar system where a discrete phase modulation of a signal is needed, and more particularly to a technique for modulating a signal transmitted or received by the radar system with an extremely accurate discrete phase modulation.

BACKGROUND OF THE INVENTION

In a radar system, both the transmit and received signal are modulated. Modulating the transmit signal with a low rate frequency modulation is used in high pulse repetition (PRF) radars for a ranging known as FM ranging. The received signal prior to the analog-to-digital converter (ADC) is modulated to control the nonlinear distortions that occur after the application of the modulation and which corrupt the Doppler spectrum and reduce the target detectability. For example, one type of modulation known as clutter tuning places the mainlobe clutter at a position in the spectrum where the harmonics of the mainlobe clutter due to the non-linearities do not interfere with the target detection process.

These modulations are conventionally performed with a finely tunable frequency synthesizer which generates a analog modulation. The extremely low noise and spurious levels which are required in some radar applications make the design of the synthesizer challenging.

Advanced radar systems require components whose noise and spurious performance are well beyond that of currently fielded systems. The noise and spurious performance of the variable frequency oscillator (VFO) used for Doppler tuning must, in particular, be dramatically improved to be compatible with these applications.

The prior art for electrically tuned phase shifters is wide and disperse. It includes analog designs using varactor tuning, switched line lengths, tapped delay lines, vector modulators, and direct digital synthesizer (DDS). With the exception of the DDS, the phase resolution and accuracy that can be achieved from these approaches is limited by fabrication precision, alignment accuracy, and parasitic effects. The DDS can achieve the phase resolution, but requires additional circuitry to provide the spurious signal performance required for radar applications

SUMMARY OF THE INVENTION

A modulator for modulating an RF signal with fixed frequency modulation with step changes of phase is described. The modulator comprises a modulating means for modulating the RF signal with a modulating signal, and means for generating the modulating signal. The generating means includes means for providing a constant frequency signal, and means for shifting the phase of said constant frequency signal by a sequence of discrete phase changes to produce the modulation signal.

In a particular embodiment, the means for shifting the phase of the constant frequency signal includes means for converting the constant frequency signal into a pulse train of period equal to the period of the constant frequency signal, and means for dividing the frequency of the pulse train signal by a factor of N, thereby increasing its period by N. The frequency dividing means includes a counter having N states and clocked by the pulse train for counting N pulses and then resetting. The phase shifting means includes means for resetting the counter to commence counting from an incremented start count state for a single cycle of division of the frequency division means, the incremented start state being incremented by M states from the counter nominal start state, thereby providing a phase change of (M/N) 360 degrees. A band pass filter centered at the constant frequency filters the frequency divider output to provide the modulating signal.

The modulator can be employed in a radar system which includes means for transmitting a sequence of pulses which are modulated with a constant frequency and step phase changes between pulses to form a transmit pulse train, the pulse train including pulse repetition intervals between pulses, antenna means for receiving return signals from the transmitted pulse train and producing receive antenna signals, and means for modulating the received antenna signals with a constant frequency modulating signal with step changes of phase between pulse repetition intervals.

BRIEF DESCRIPTION OF THE DRAWING

These and other features and advantages of the present invention will become more apparent from the following detailed description of an exemplary embodiment thereof, as illustrated in the accompanying drawings, in which:

FIG. 1 is a simplified block diagram of a modulation system embodying the invention which applies modulation to the signal received in a radar system.

FIG. 2A illustrates an exemplary transmit pulse train. FIG. 2B illustrates the receive active intervals. FIG. 2C shows the modulation signal applied by the system of FIG. 1.

FIG. 3 is a simplified block diagram of a modulation system embodying the invention which applies modulation to the signal transmitted by a radar system.

FIGS. 4A and 4B illustrate respectively an exemplary transmit pulse train and a modulation signal applied to the pulse train in accordance with the invention.

FIG. 5 is a simplified block diagram showing an alternate embodiment of a radar receive system in accordance with the invention.

DETAILED DESCRIPTION OF THE PREFERRED EMBODIMENT

Figure 6:
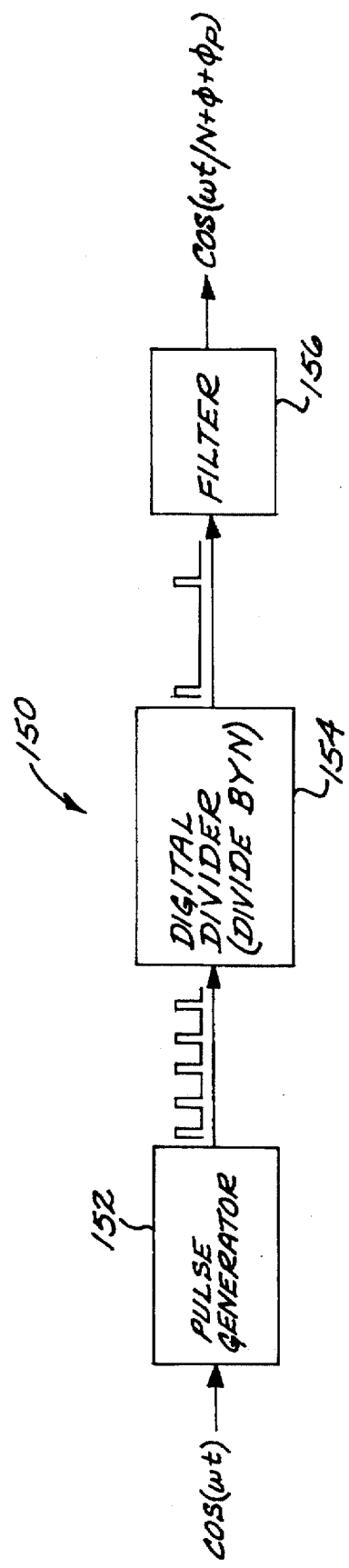
FIG. 6 is a simplified block diagram showing a phase shifter using a modified digital frequency divider in accordance with the invention.

One aspect of this invention involves the application of modulation by discrete phases from pulse-to-pulse in a radar system. Frequency dividers are employed in accordance with the invention to accurately generate the discrete phases. This modulation scheme can be used to replace the conventional analog modulations used in radars prior to analog-to-digital (A/D) conversion to control distortion. In addition, this modulation can be used to alter the transmit waveform to control receive distortion, as discussed above, or to supply a quadratic phase pulse-to-pulse to provide the ranging capabilities normally provided by FM ranging as used in high PRF waveforms. It is recognized that the ranging is due to the quadratic phase pulse-to-pulse and not to the linear frequency modulation.

The use of digital frequency dividers to derive the accurate phase allows the discrete phases to be generated with sufficient accuracy to achieve the requirements for high performance radar systems. A direct digital synthesizer is a form of a frequency divider and could alternatively be used in this application. However, the use of discrete phase changes is unique. The modulation technique described herein can also be used in other parts of a radar system or other applications. The modulation is applicable to systems which require a pulse like modulation.

The invention recognizes that the modulation applied to the incoming signal prior to A/D conversion to control distortions, e.g., clutter tuning, can be a discrete phase modulation. The discrete phase modulation is characterized by a fixed frequency modulation with step changes of phase being performed on a pulse-to-pulse basis. A preferred implementation of the discrete phase modulation employs a digital frequency divider having excellent spectral properties. These excellent spectral properties map into exceptionally accurate phase states for the discrete modulation.

FIG. 1 illustrates an exemplary simplified block diagram of a modulation system 50 in accordance with the invention. The radar return signal is received at the radar antenna 52, and applied to mixer 54, where the return signal is modulated by the signal $\cos(\omega t+\phi_p)$. The modulating signal changes by discrete changes in the phase $\phi_p$ from one receive active interval to the next. The modulated signal is then passed to the I/Q detector 58, the detected signal is converted to a digital signal by A/D convertor 58, and the digitized signal is passed to the receiver digital signal processor for further processing.

FIGS. 2A–2C illustrate respectively an exemplary transmit pulse train, the receiver active intervals, and the modulation signal applied in accordance with the invention. Since the radar on receive is gated off during the transmit pulse event and no signal is received during this period, the transients due to the discrete phase change settle in this period prior to application to the received signal during the receive period. The sequences of phases, $\phi_p$, applied during sequential receive intervals can change in a linear manner, e.g., 0°, 4°, 8°, 12°, ..., to achieve Doppler tuning or in a nonlinear manner for other purposes. FIG. 2C is not intended to illustrate accurately different phase values, but rather the manner in which the phases could be changed from one PRI interval to the next.

Furthermore, the disclosed invention recognizes that a modulation applied to the transmit signal to control distortion, e.g., clutter tuning, and to provide the ranging capabilities like FM ranging in high PRF, can be a discrete phase modulation. The resultant transmit waveform is characterized by a fixed frequency modulation with step changes of phase being performed on a pulse-to-pulse basis. A preferred implementation of the discrete phase modulation employs the same device discussed for the implementation in the receiver.

FIG. 3 illustrates an exemplary simplified block diagram of a transmit modulation system 100 in accordance with the invention. The basic radar waveform from the exciter (not shown) is applied to a mixer 102 where the waveform is modulated by $\cos(\omega t+\phi_p)$. The modulating signal changes, in accordance with the invention, by discrete phase, $\phi_p$, from one pulse p to the next. The resultant signal is passed to the transmit amplifier 104 and the antenna 106.

FIGS. 4A and 4B illustrate respectively an exemplary transmit pulse train (FIG. 4A) and the modulation applied in accordance with the invention (FIG. 4B). During the receive period, the transients due to the discrete phase changes are allowed to settle. The sequence of phases $\phi\Delta_p$ can change in a linear manner, e.g., 0°, 4°, 8°, ..., to achieve Doppler tuning of the received signal or in a nonlinear manner. Changing the phase in a quadratic manner, e.g., 1°, 4°, 9°, 16°, 25°, ..., provides a resultant waveform which can be used in place of conventional FM ranging.

FIG. 5 illustrates the sequence of processing the received signal, which have been modulated by the system 100, for the waveform with the quadratic phase modulation. In the receiver system 50', the radar signal is received by a conventional receiver 48. The receiver 48 includes the detector and ADC elements shown as elements 56 and 58 in FIG. 1. The receiver output from the ADC is phase shifted with a multiplier 60 in the receiver digital processor by the same quadratic sequence used on transmit. The multiplier output is Doppler filtered by filter 62 in a manner similar to the Doppler filtering employed in conventional FM ranging. The phase shift could be alternatively introduced before the A/D converter with a discrete phase modulator if desired, i.e., in a manner similar to that shown in FIG. 1. Finally, conventional thresholding of Doppler filters takes place at thresholding function 64 to form target hits. As in conventional FM ranging, a target hit will occur in a Doppler filter which correspond to a linear combination of the target Doppler and range.

Applications of these approaches to high performance radar systems require the accuracy of the discrete phase be quite precise. This is achieved in accordance with one aspect of the invention by observing that a discrete phase change of a constant frequency signal is equivalent to a time delay or advance. This is seen by noting that $$\cos(\omega t+\phi)=\cos(\omega[t+T])$$

where $\omega$ is the center frequency, t is the time variable, $\phi$ is the phase, and $T=\phi\omega$ The time delay is easily implemented with the use of digital frequency dividers which have counting circuits to perform the frequency division. For example, consider the frequency divider system 150 shown in FIG. 6. The system has a constant frequency signal cos(ωt) as an input, and divides the frequency by N. First, the input signal is converted into a pulse stream by pulse generator 152; the pulse stream is provided as an input to the digital frequency divider 154. The divider 154 includes a counter to count pulses, and when the count reaches N, a pulse is generated which restarts the counter. The pulse stream coming out of the divider 104 is filtered by a filter 156 to remove harmonics of the pulse stream, and the resultant signal is a constant frequency signal whose frequency is the input frequency divided by N.

Figure 7:
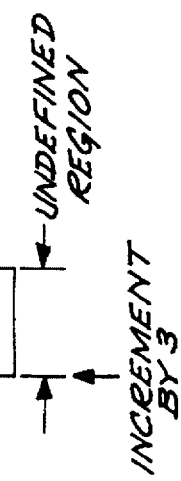
FIG. 7 illustrates the counter states of the counter comprising the frequency divider of FIG. 6.

To use circuit 150 as a phase shifter, the divider counter state is incremented at the beginning of the transmit pulse event by M counts as shown in FIG. 7. The undefined region in FIG. 7 depicts that the exact time of the phase shift is not important. FIG. 7 illustrates the exemplary case in which M=3. This will provide a phase change of 360° (M/N) between pulses. Thus, the signal out of the frequency divider system 150 is advanced relative to the signal output from the divider system for the prior pulse repetition interval (PRI), which constitutes a phase change. Since the frequency dividers are very precise devices, the accuracy of the phase shift is also very precise.

Figure 8:
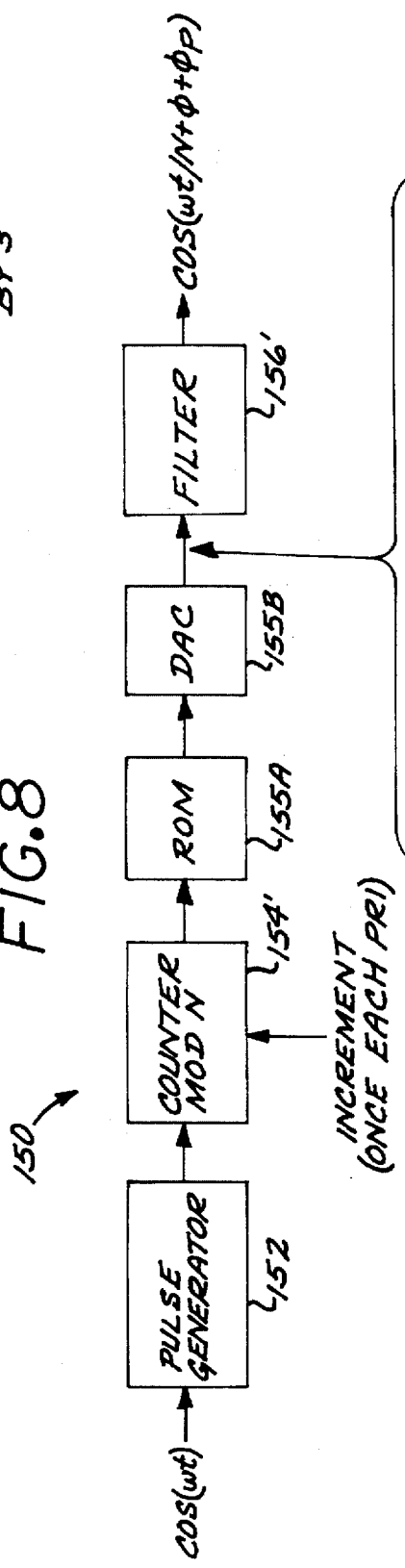
FIG. 8 illustrates an alternate embodiment of a phase shifter in accordance with the invention.
Figure 9:
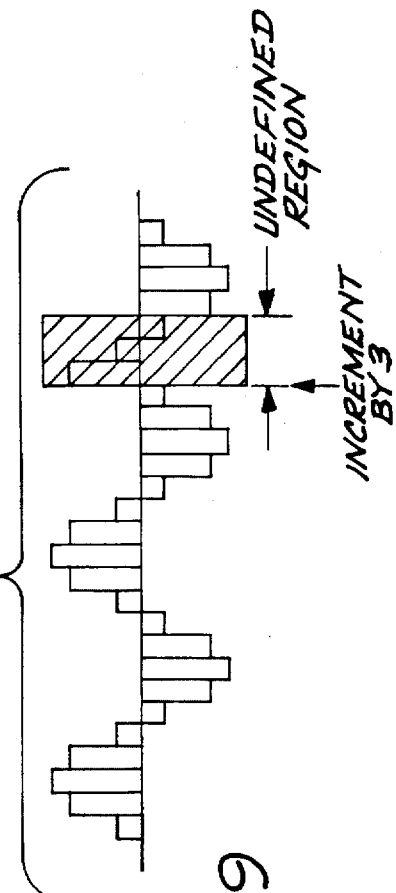
FIG. 9 is a representation of the output of the digital-to-analog converter comprising the phase shifter shown in FIG. 8.

An issue with the above approach is the filter settling time at the phase changes. To reduce the filtering requirement and control the transient period, an alternative to the frequency divider with a pulse stream for an output is used. For this alternative embodiment, illustrated in FIG. 8 as system 150', the counter in the frequency divider 154' addresses a read only memory (ROM) 155A to read a value which drives a digital-to-analog converter (DAC) 155B and produces an approximation of a sine wave (FIG. 9), where one cycle of the sine wave occurs for N input pulses. The filtering requirements required of filter 156' for this discrete signal are less stringent than the filtering requirements of the pulse train of the embodiment of FIG. 6. When the counter comprising divider 154' is incremented to effect a phase change, the signal is advanced and a phase change occurs. This is depicted in FIG. 9.

The system 150' shown in. FIG. 8 is similar to a DDS with special control circuitry. The signal out of the divider 154' is periodic versus the output of a conventional DDS, which due to approximations in the internal mechanization of the DDS may only approach being periodic. Hence, the harmonics of the frequency divider 154' can be filtered out to provide a clean signal, but the DDS will generate additional distortions which cannot be removed by filtering if the periodicity is not maintained.

For some systems, phase states of the form (M 360°)/N will be too coarse for reasonable size N. For example, a dividing ratio of 1000 is an unrealistic for the current state-of-the-art with a single digital divider. Commonly assigned, copending applications Ser. No. 08/576,328, filed Dec. 21, 1995, entitled "Precision Digital Phase Shifter," attorney docket number PD-92593, and Ser. No. 08/576,329, filed Dec. 21, 1995, entitled "Digital Frequency Divider Phase Shifter," attorney docket number PD-93310, describe digital phase shifters which overcome such limitations. The entire contents of these copending applications are incorporated herein by this reference.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A radar system, comprising:
   a radar transmitter system for transmitting a sequence of pulses to form a transmit pulse train, said pulse train including pulse repetition intervals between pulses;
   a receiver system for receiving return signals from said transmitted pulse train and producing receive antenna signals; and
   means for modulating said received antenna signals with a constant frequency modulating signal with step changes of phase from pulse to pulse.

2. The radar system of claim 1 wherein said modulating means comprises means for generating said modulating signal, said generating means including:
   means for providing a constant frequency signal; and
   means for sequentially shifting the phase of said constant frequency signal by a sequence of discrete phase changes to produce said modulation signal.

3. The radar system of claim 2 wherein said means for shifting the phase of said constant frequency signal includes:
   means for converting said constant frequency signal into a pulse train of period equal to the period of said constant frequency signal;
   means responsive to said pulse train for dividing the frequency of pulse train signal by a factor of N, thereby increasing its period by said factor of N, said means including a counter clocked by said pulse train for counting N pulses and then resetting, said counter having N states; and
   means for resetting said counter to commence counting from an incremented start count state for a single cycle of division of said frequency division means, said incremented start state being incremented by M states from the counter nominal start state, thereby providing a phase change of (M/N) 360 degrees.

4. The radar system of claim 1 wherein said means for shifting the phase of said constant frequency signal further comprises a band pass filter centered at said constant frequency.

5. The radar system of claim 1 wherein said step phase changes comprise a linear progression of phase shift values.

6. A radar system, comprising:
   a radar transmitter system for transmitting a sequence of pulses to form a transmit pulse train, said pulse train including pulse repetition intervals between pulses, said transmitter system including means for modulating said pulses with a constant frequency modulating signal with transmit step changes of phase from pulse to pulse; and
   a receiver system for receiving return signals from said transmitted pulse train and producing received signals.

7. The radar system of claim 6 wherein said modulating means comprises means for generating said modulating signal, said generating means including:
   means for providing a constant frequency signal; and
   means for sequentially shifting the phase of said constant frequency signal by a sequence of discrete phase changes to produce said modulation signal.

8. The radar system of claim 7 wherein said means for shifting the phase of said constant frequency signal includes:
   means for converting said constant frequency signal into a pulse train of period equal to the period of said constant frequency signal;
   means responsive to said pulse train for dividing the frequency of pulse train signal by a factor of N, thereby increasing its periodicity by said factor of N, said means including a counter clocked by said pulse train for counting N pulses and then resetting, said counter having N states; and means for resetting said counter to commence counting from an incremented start count state for a single cycle of division of said frequency division means, said incremented start state being incremented by M states from the counter nominal start state, thereby providing a phase change of (M/N) 360 degrees.

9. The radar system of claim 6 wherein said means for shifting the phase of said constant frequency signal further comprises a band pass filter centered at said constant frequency.

10. The radar system of claim 6 wherein said step phase changes comprise a linear progression of phase shift values.

11. The radar system of claim 6 wherein said step phase changes comprise a quadratic progression of phase shift values.

12. The radar system of claim 6 wherein said receiver system further includes means for modulating said received signals with a constant frequency modulating signal with receive step changes of phase from pulse to pulse, said step changes corresponding to said transmit step changes.

13. The radar system of claim 12 wherein said transmit and said receive step changes comprise a quadratic progression of phase shift values, and said modulated received signals are passed through a Doppler filtering system and subjected to a thresholding function to detect target range and Doppler.

14. A modulator for modulating an RF signal with fixed frequency modulation with step changes of phase, comprising:

a modulating circuit for modulating said RF signal with a modulating signal; and a signal generator for generating said modulating signal, said generator including:

(a) means for providing a constant frequency signal; and (b) means for shifting the phase of said constant frequency signal by a sequence of discrete phase changes to produce said modulating signal, said means for shifting the phase of said constant frequency signal including:

(i) means for converting said constant frequency signal into a pulse train waveform of periodicity corresponding to the periodicity of said constant frequency signal, (ii) means responsive to said pulse train waveform for dividing the frequency of said pulse train waveform by a factor of N, thereby increasing its period by said factor of N, said means including a counter clocked by said pulse train for counting N pulses and then resetting, said counter having N states, and (iii) means for resetting said counter to commence counting from an incremented start count state for a single cycle of division of said frequency division means, said incremented start state being incremented by M states from the counter nominal start state, thereby providing a phase change of (M/N) 360 degrees.

15. A modulator for modulating an RF signal with fixed frequency modulation with step changes of phase, comprising:

a modulating circuit for modulating said RF signal with a modulating signal; and a signal generator for generating said modulating signal, said generator including:

(a) means for providing a constant frequency signal; and (b) means for shifting the phase of said constant frequency signal by a sequence of discrete phase changes to produce said modulating signal, said means for shifting the phase including a band pass filter centered at said constant frequency.

* * * * *